United States Patent [19]

Otsuki et al.

[11] Patent Number: 5,894,139
[45] Date of Patent: Apr. 13, 1999

[54] SEMICONDUCTOR DEVICE STRUCTURE FOR INSULATED GATE BIPOLAR TRANSISTOR

[75] Inventors: Masahito Otsuki; Ryu Saito; Yasuhiko Onishi, all of Nagano, Japan

[73] Assignee: Fuji Electric Co., Ltd., Japan

[21] Appl. No.: 08/864,290

[22] Filed: May 28, 1997

[30] Foreign Application Priority Data

May 30, 1996 [JP] Japan .................................. 8-136801

[51] Int. Cl.$^6$ .......................... H01L 29/74; H01L 31/111
[52] U.S. Cl. .................... 257/139; 257/140; 257/146
[58] Field of Search .................................. 257/139, 140, 257/146, 147, 341, 342, 401

[56] References Cited

U.S. PATENT DOCUMENTS

| | | | |
|---|---|---|---|
| 5,057,884 | 10/1991 | Suzuki et al. | 257/341 |
| 5,124,772 | 6/1992 | Hideshima et al. | 257/139 |
| 5,247,207 | 9/1993 | Wert et al. | 307/270 |
| 5,296,725 | 3/1994 | Nandakuman et al. | 257/139 |
| 5,475,252 | 12/1995 | Merrill et al. | 257/341 |

FOREIGN PATENT DOCUMENTS 1-265569  10/1989  Japan .................................. 257/139

*Primary Examiner*—Wael Fahmy
*Attorney, Agent, or Firm*—Rossi & Associates

[57] ABSTRACT

A semiconductor device is provided which includes a first-conductivity-type collector layer having a rear surface on which a collector electrode is formed, a second-conductivity-type buffer layer laminated on the collector layer, a second-conductivity-type conductivity modulation layer formed on the buffer layer, a first-conductivity-type emitter layer formed as a well in a surface of the conductivity modulation layer, a second-conductivity-type source region formed in a surface of a well edge portion of the emitter layer, a gate electrode formed through a gate insulating film to overlap the source region and the conductivity modulation layer, and an emitter electrode that is in ohmic contact with both the emitter layer and the source region. In the present device, the second-conductivity-type source region includes a second-conductivity-type source region formed in the well edge of the emitter layer, and a second-conductivity-type source contact region formed adjacent to the source region and held in ohmic contact with the emitter electrode. This source contact region has a higher impurity concentration than the source region.

7 Claims, 14 Drawing Sheets

SEMICONDUCTOR DEVICE STRUCTURE FOR INSULATED GATE BIPOLAR TRANSISTOR

FIELD OF THE INVENTION

The present invention generally relates to a semiconductor device, and in particular to a semiconductor device structure for an insulated gate bipolar transistor (IGBT).

BACKGROUND OF THE INVENTION

As a switching semiconductor device having a large-current capacity and low saturation voltage (low ON-state voltage), there is known an insulated gate bipolar transistor (IGBT) that is also called a conductivity modulation type transistor. As shown in FIG. 16, a known semiconductor structure of pnp type IGBT includes a p$^+$-type collector layer (minority carrier injected layer) having a rear surface connected to a collector electrode 1, n$^+$-type buffer layer 3 laminated on the collector layer 2, and an n$^-$-type conductivity modulation layer (n base) 4 formed by epitaxial growth on the buffer layer 3. The semiconductor structure further includes a gate electrode 6 made of polysilicon and formed on the surface of the conductivity modulation layer 4 through a gate insulating film 5, p-type emitter layer (p base) 7 formed as a well in a surface of the conductivity modulation layer 4 by self alignment using the gate electrode 6 as a mask, n$^+$-type source region 9, and an aluminum emitter electrode 8 formed on the emitter layer 7.

In the IGBT having the above-described vertical DMOS structure, when a positive potential with respect to the emitter electrode 8 is applied to the gate electrode 6, an n channel as an inversion layer is formed in a surface of the p-type emitter layer 7 which provides a channel diffusion layer (back gate) right under the gate electrode 6. Through this channel, electrons (majority carriers of the n$^-$-type conductivity modulation layer 4) are injected from the emitter electrode 8 and source region 9 into the conductivity modulating layer 4. In response to this, holes (minority carriers of the n$^-$-type conductivity modulating layer 4) are injected from the collector layer 2 into the conductivity modulation layer 4, with a result of a rapid increase in the conductivity of the conductivity modulation layer 4. As a result, the pnp transistor is turned on, and large current flows through the transistor, to provide a low ON-state voltage (low collector-emitter voltage).

When a load is short-circuited, for example, hole current $I_H$ flowing into the emitter electrode 8 through the portion of the emitter layer 7 right under the source region 9 is rapidly increased, and the voltage drop due to the diffusion resistance (p base resistance) $r_B$ at the portion right under the source region 9 is increased. As a result, the pn junction between the p-type emitter layer 7 and the n$^+$-type source region 9 tends to be forward biased, resulting in latch-up of a parasitic transistor (npn-type transistor consisting of the n$^-$-type conductivity modulation layer 4, p-type emitter layer 7 and the n$^+$-type source region 9). Thus, the known IGBT has low capability to withstand breakdown upon load short-circuiting (i.e. low ability to prevent latch-up).

To improve the ability to prevent latch-up, it is effective to lower the current amplification factor $h_{FE}$ of the parasitic npn-type transistor. To this end, the impurity concentration of the p-type emitter layer 7 or that of the n$^+$-type source region 9 needs to be lowered. If the impurity concentration of the p-type emitter layer 7 is lowered, however, the diffusion resistance rB in the emitter layer 7 is undesirably increased. If the impurity concentration of the n$^+$-type source region 9 is lowered, the contact resistance between the source region 9 and the emitter electrode 8 is increased.

In view of the above, a structure as shown in FIG. 17 has been proposed which is intended to enhance the ability to prevent latch-up upon load short-circuiting, for example. In the IGBT structure shown in FIG. 17(a), the emitter electrode 8 does not directly contact the stripe-like source region 9 which extends in the gate-width (channel-width) direction of the gate electrode 6, but is in 5 conductively contact with a plurality of branch portions 9a that extend like a comb from the source region 9, such that the diffusion resistance $r_s$ exists as a parasitic element in each narrowed branch portion 9a.

Thus, in the IGBT semiconductor structure in which the diffusion resistance $r_s$ is equivalently present between the source region 9 and the emitter electrode 8, even if the voltage drop due to the diffusion resistance $r_B$ increases with a rapid increase in the hole current $I_H$ flowing into the emitter electrode 8 through the portion of the emitter layer 7 right under the source region 9 upon load short-circuiting, for example, the voltage drop due to the diffusion resistance $r_s$ increases at the same time with a rapid increase in the electron current $I_E$ flowing through the source region 9. Due to the increases in the voltage drops due to both of the diffusion resistance $r_B$, $r_S$, the pn junction between the emitter layer 7 and the source region 9 is less likely to be forward biased, thus reducing the likelihood of latch-up of the parasitic npn-type transistor. Thus, the IGBT structure of FIG. 17(a) shows increased capability to withstand breakdown upon load short-circuiting.

In the IGBT structure as shown in FIG. 17(b), a plurality of mutually isolated source regions 9b are formed such that these regions 9b are spaced from each other in the gate-width (channel-width) direction of the gate electrode 6, and the emitter electrode 8 is formed to overlap these source regions 9b. In this locally disconnected channel structure, the emitter electrode 8 is not conducted to the channel right under the gate electrode 6 through the portions interposed between the source regions 9b, and thus the diffusion resistance $r_s$ exists as a parasitic element between the source regions 9b and the emitter electrode 8, as in the structure of FIG. 17(a). In this arrangement, the structure of FIG. 17(b) also shows improved capability to withstand breakdown upon load shortcircuiting, due to the concurrent increases in the voltage drops due to the diffusion resistance.

In the IGBT structures as shown in FIGS. 17(a), 17(b), however, there is a problem as described below. Namely, these structures are effective to improve the ability to prevent latch-up by rapidly increasing the voltage drop due to the diffusion resistance $r_s$ of the source region 9, where excess voltage is applied, for example, upon load short-circuiting. In the normal ON state (when no excess voltage is applied), however, electron current flows into the diffusion resistance $r_s$, and the voltage drop due to the resistance is continued, with a result of an increased ON-state voltage (collector saturation voltage) $V_{CE(sat)}$, and increased ON-state loss.

SUMMARY OF THE INVENTION

It is therefore an object of the present invention which provides a semiconductor device with an insulated gate bipolar transistor whose structure or electric characteristic is improved, so as to operate with a low ON-state voltage during a normal operation, while assuring a high capability to prevent latch-up of a parasitic transistor.

To accomplish the above object, there is provided according to the first aspect of the present invention a semiconductor device which comprises: a first-conductivity-type collector layer having a rear surface on which a collector electrode is formed; a second-conductivity-type buffer layer laminated on the collector layer, a second-conductivity-type conductivity modulation layer formed on the buffer layer; a first-conductivity-type emitter layer formed as a well in a surface of the conductivity modulation layer; a second-conductivity-type source region formed in a surface of an edge portion of the emitter layer; a gate electrode formed through a gate insulating film to overlap the source region and the conductivity modulation layer; and an emitter electrode that is in ohmic contact with both the emitter layer and the source region; wherein the second-conductivity-type source region includes a second-conductivity-type source region formed in the edge of the emitter layer, and a second-conductivity-type source contact region formed adjacent to the source region and held in ohmic contact with the emitter electrode, the source contact region having a higher impurity concentration than the source region.

In the semiconductor device as described above, the second-conductivity-type source region does not have a uniform impurity concentration, but consists of a high-impurity-concentration source contact region, and a source region having a lower impurity concentration than the source contact region. In this arrangement, the current amplification factor of a parasitic transistor (consisting of the conductivity modulation layer, emitter layer and source region), which tends to latch up upon load short-circuiting, is lower than that of the known structure, thus assuring improved ability to prevent latch-up of the parasitic transistor upon load short-circuiting. With the high-impurity-concentration source contact region attached or connected to the source region, the contact resistance is not increased, and the low ON-state voltage can be maintained. Also, the turn-on speed is not reduced.

In one preferred form of the above aspect of the invention, the first-conductivity-type emitter layer includes a first-conductivity-type high-impurity-concentration main emitter region in the form of a well, and a first-conductivity-type outer-contact emitter region in the form of a well, which is formed adjacent to a well edge of the main emitter region, to be located outside a small-depth portion of the main emitter region. In this case, since the emitter layer is divided into regions having different impurity concentrations, i.e., into the outer-contact emitter region which provides the channel diffusion layer of the MOS portion, and the high-impurity-concentration main emitter region, the diffusion resistance value of the portion right under the source contact region is reduced due to the high impurity concentration of the main emitter region, without incurring variations in the threshold voltage of the MOS portion, thus minimizing the likelihood of latch-up. Thus, the present structure shows improved ability to prevent latch-up of the parasitic transistor.

In another preferred form of the invention, the first-conductivity-type emitter layer further includes a first-conductivity-type inner-contact emitter region in the form of a well, which is formed adjacent to the well edge of the main emitter region, to be located inside the small-depth portion of the main emitter region, and has a higher impurity concentration than the main emitter region. In this arrangement, the diffusion resistance value is further reduced since the inner-contact emitter region having a higher impurity concentration than the main emitter region is formed in addition to the high-impurity-concentration emitter region.

The main emitter region may include a first-conductivity-type comb-shaped expanded portion which extends through a connected portion between the source region and the source contact region up to a surface of the source region. In this case, the diffusion resistance exists as parasitic elements in narrowed portions of the second-conductivity-type source region that are defined by the expanded portion of the emitter region. In this arrangement, even if the potential of the outer-contact emitter region increases with a voltage drop due to the diffusion resistance in the emitter region when excess current flows upon load short-circuiting, the voltage of the source region increases at the same time with a voltage drop due to the above parasitic resistance. As a result, the pn junction between the source region and the outer-contact emitter region is less likely to be forward biased, assuring increased ability to prevent latch-up.

According to the second aspect of the present invention, there is provided a semiconductor device comprising: a first-conductivity-type first insulated gate bipolar transistor (IGBT) in which current is controlled by a gate electrode; and a first-conductivity-type second IGBT which is connected to the first IGBT in parallel to provide a monolithic structure, and in which current is controlled by the gate electrode, the second IGBT having a threshold voltage $V_{TH2}$ that is higher on the order of 1 volt than a threshold voltage $V_{TH1}$ of the first IGBT. In this circuit arrangement, the threshold voltage of the composite IGBT is made equal to the low threshold voltage of the first IGBT, whereby normal switch-on/off operations can be effected without any problem, and the ON-state voltage is not increased. Upon short-circuiting of a load, the value of the collector saturation current of the composite IGBT is made lower than that of the first IGBT 1, thus assuring improved capability to withstand short-circuiting of a load.

In one preferred form of the second aspect of the invention, the first IGBT has an ON-state resistance that is higher than an ON-state resistance of the second IGBT. In this case, the transconductance of the IGBT 1 becomes smaller than that of the IGBT 2, thereby enabling the composite IGBT to suppress the excess current upon load short-circuiting.

According to a third aspect of the present invention, there is provided a semiconductor device which comprises: a first-conductivity-type collector layer having a rear surface on which a collector electrode is formed; a second-conductivity-type buffer layer laminated on the collector layer, a second-conductivity-type conductivity modulation layer formed on the buffer layer; a first-conductivity-type emitter layer formed as a well in a surface of the conductivity modulation layer, a second-conductivity-type source region formed as a well in a surface of a well edge portion of the emitter layer; a first gate electrode formed through a gate insulating film to overlap the source region and the conductivity modulation layer; a second-conductivity-type source contact layer formed in a surface of the emitter layer to be spaced from the source region; a second gate electrode formed through a gate insulating film to overlap the source region and the source contact layer; and an emitter electrode that is in ohmic contact with both the emitter layer and the source contact layer.

When short-circuiting of a load occurs, the lateral MOSFET consisting of the source contact layer, source region and second gate electrode operates in a saturated region (non-linear region), in which the excess current is unlikely to flow since the current is limited by the saturation current. Thus, the present semiconductor device has an improved ability to prevent latch-up of a parasitic transistor. Since the lateral MOSFET is turned off upon turn-off of the IGBT, the source region is not connected to the emitter electrode and brought into the floating condition. This makes it possible to prevent latch-up which would otherwise be likely to occur upon turn-off.

In one preferred form of the above aspect of the invention, the semiconductor device further includes a second emitter electrode which is in ohmic contact with the surface of the well edge portion of the emitter layer. Since the current flows into the second emitter electrode through a shorter path in the emitter layer, the diffusion resistance value is lowered, and the capability to withstand load short-circuiting can be further improved.

BRIEF DESCRIPTION OF THE DRAWINGS

This invention will be described in greater detail with reference to certain preferred embodiments thereof and the accompanying drawings, wherein.

DETAILED DESCRIPTION OF THE PREFERRED EMBODIMENTS

First Embodiment

Figure 1:
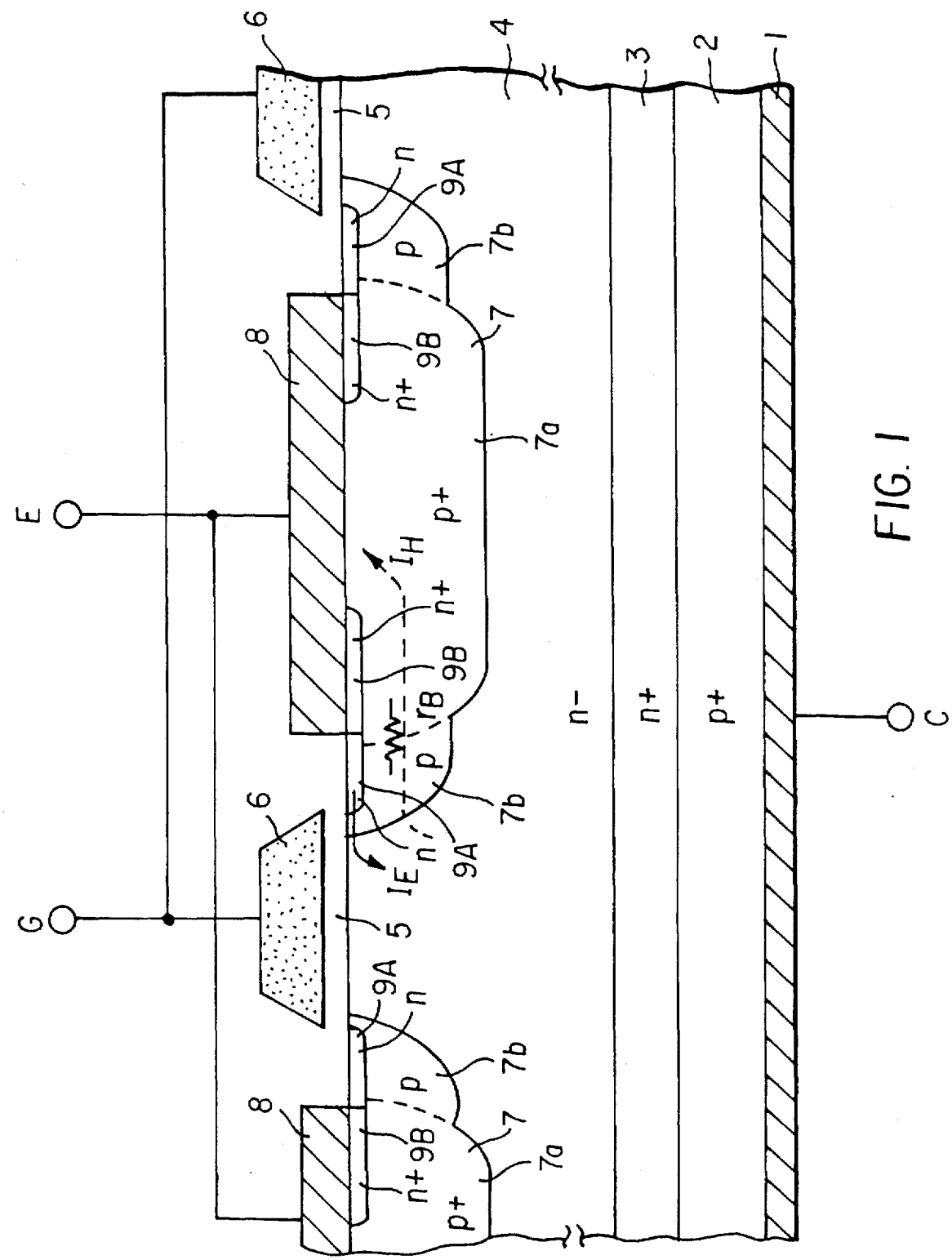
FIG. 1 is a cross sectional view showing an IGBT semiconductor structure according to the first embodiment of the present invention.

FIG. 1 is a cross sectional view showing an IGBT semiconductor structure according to the first embodiment of the present invention.

The IGBT semiconductor structure of the present embodiment, which is of pnp type, includes a $p^+$-type collector layer (minority carrier injected layer) 2 having a rear surface connected to a collector electrode 1, $n^+$-type buffer layer 3 laminated on this collector layer 2, n-type conductivity modulation layer (n base) 4 that is epitaxially grown on the buffer layer 3, and $p^+$-type main emitter regions (p base) 7a in the form of deep wells, which are formed in the surface of the conductivity modulation layer 4. The semiconductor structure further includes gate electrodes 6 made of polysilicon and formed on the surface of the conductivity modulation layer 4 through gate insulating films 5, outer-contact p-type emitter regions 7b formed adjacent to the well edges of the main emitter regions 7a, i.e., formed outside small-depth portions of the main emitter layers 7a, small-depth n-type source regions 9A formed in the surfaces of the outer-contact emitter regions 7b, $n^+$-type source contact regions 9B formed in the surfaces of the main emitter regions 7a and connected to the n-type source regions 9A, and emitter electrodes 8 made of aluminum and held in ohmic contact with both the source contact regions 9B and main emitter regions 7a.

Figure 16:
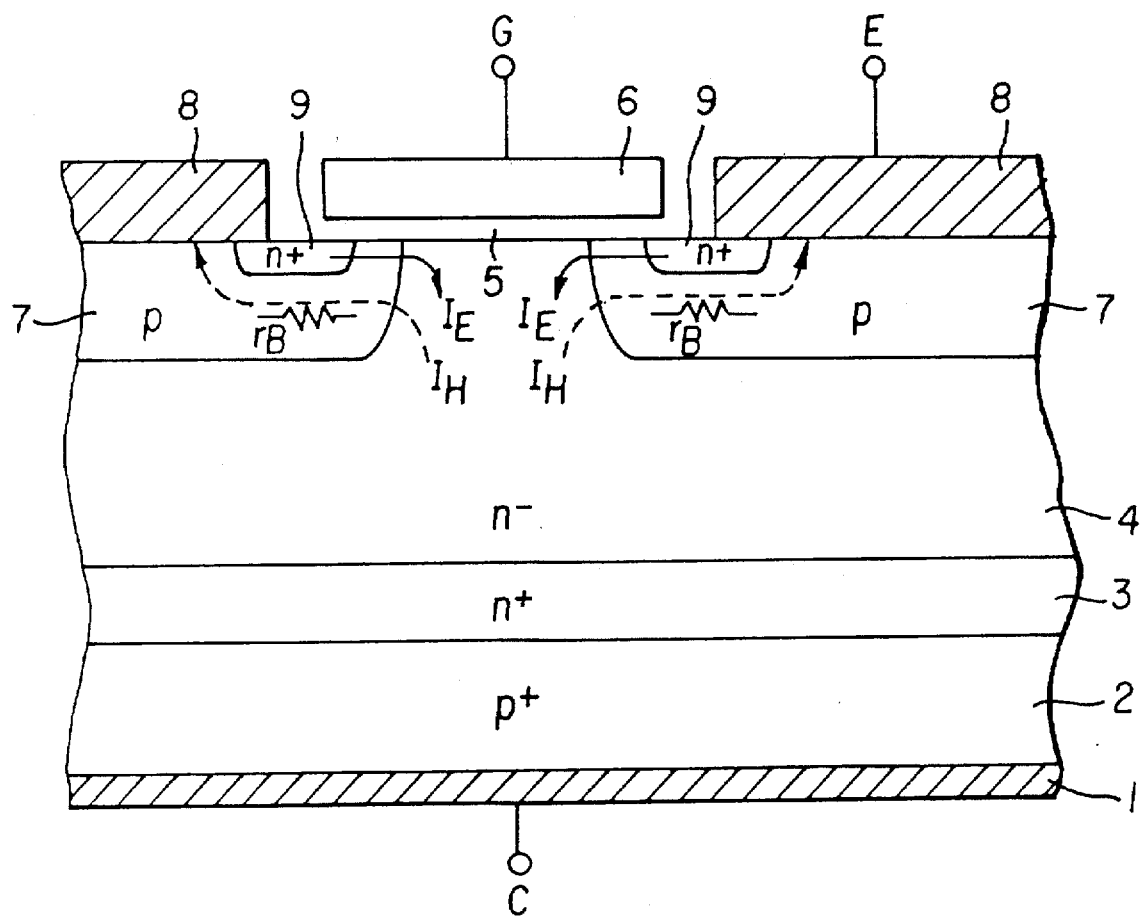
FIG. 16 is a cross sectional view showing a general semiconductor structure of a known IGBT.
Figure 17A:
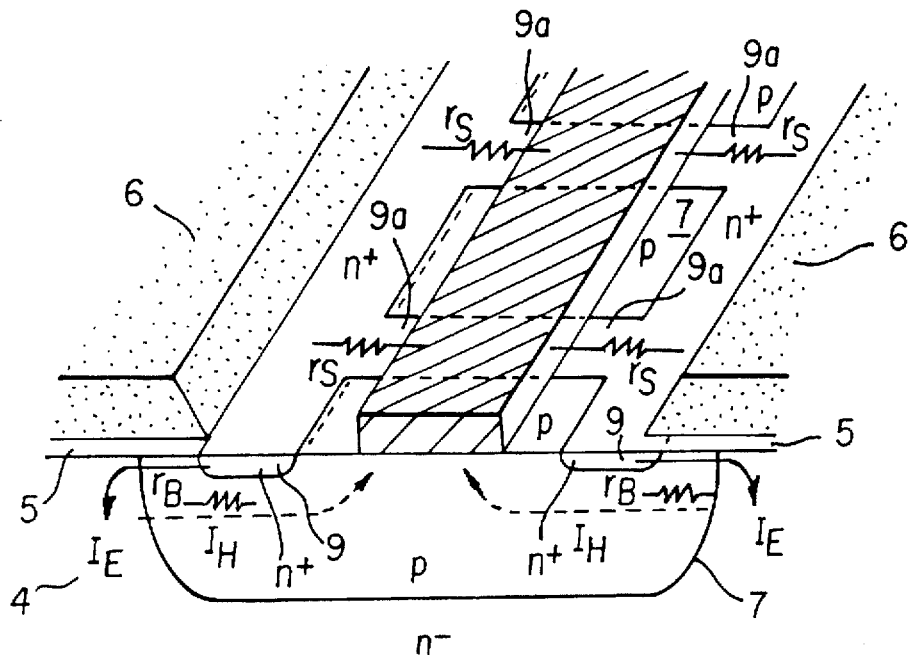
FIG. 17(a) is a perspective view in cross section, showing a semiconductor structure of a known IGBT wherein diffusion resistance is provided in narrowed portions of a source region.
Figure 17B:
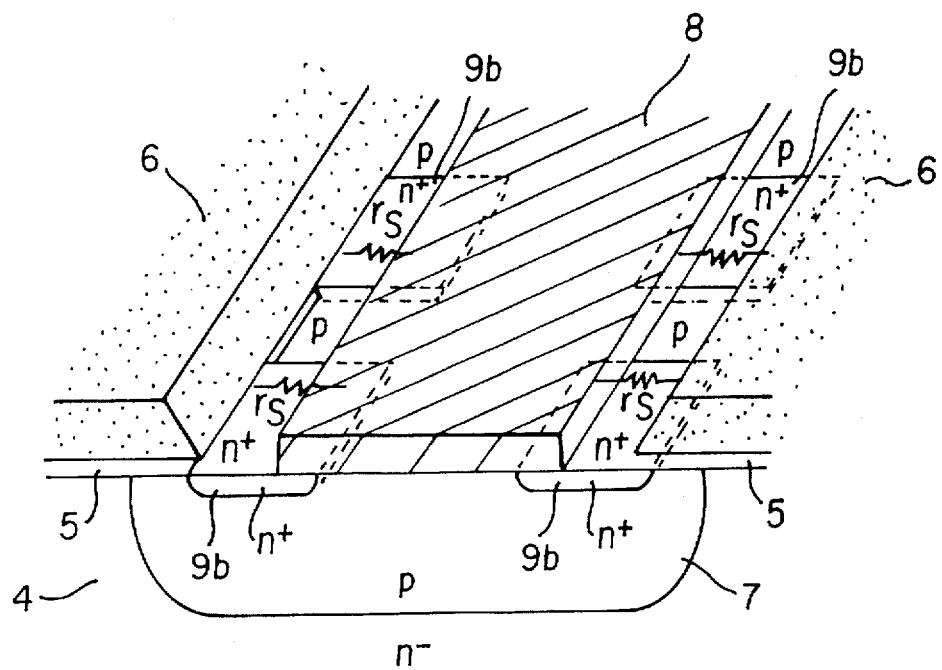
FIG. 17(b) is a perspective view in cross section, showing another semiconductor structure of a known IGBT which has a locally disconnected channel structure.

In comparison with the known structure of IGBT as shown in FIG. 16, the IGBT structure of the present embodiment has novel features that each $n^+$-type source region 9 of the known structure is divided into the source region 9A of a limited size, and the high-impurity-concentration source contact region 9B that is in ohmic contact with the corresponding emitter electrode 8.

Since the n-type source region 9A having a relatively low impurity concentration, rather than that of $n^+$-type, is used in the present embodiment, a parasitic transistor (npn type transistor consisting of $n^-$-type conductivity modulation layer 4, p-type outer-contact emitter region 7b and n-type source region 9A) which tends to latch up upon load short-circuiting has a lower current amplification factor $h_{FE}$ than that of the known structure shown in FIG. 16. Thus, the present structure has an improved ability to prevent latch-up, and increased capability to withstand breakdown upon load short-circuiting. With the $n^+$-type source contact region 9B connected to the n-type source region 9A, the contact resistance is not increased, and the ON-state voltage can be maintained at a low level, while the turn-on speed is not reduced.

Further, in the present embodiment, each emitter layer 7 is divided into regions having different impurity concentrations, namely, into the p-type outer-contact emitter region 7b which provides a channel diffusion layer of a MOS portion, and the p$^+$-type main emitter region 7a. In this arrangement, the diffusion resistance (p base resistance ) $r_B$ in the portion of the emitter layer 7 right below the source contact region 9B is particularly reduced owing to the increased impurity concentration of the main emitter region 7a, without incurring variations in the threshold voltage of the MOS portion. Accordingly, the voltage drop due to the diffusion resistance $r_B$ caused by hole current $I_H$ can be reduced when a load is short-circuited, and the pn junction between the outer-contact emitter region 7b and source region 9A is less likely to be forward-biased, thereby minimizing the likelihood of parasitic latch-up. Thus, the present structure exhibits improved ability to prevent latch-up than the known structure.

Figure 2A:
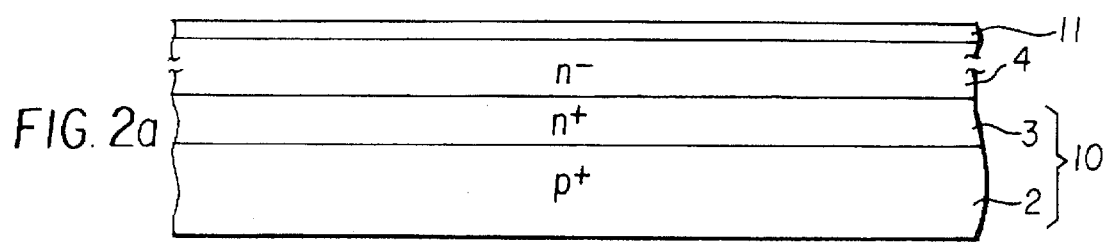
FIGS. 2(a)-2(e) are cross sectional views showing steps of manufacturing the semiconductor structure of the first embodiment.
Figure 2B:
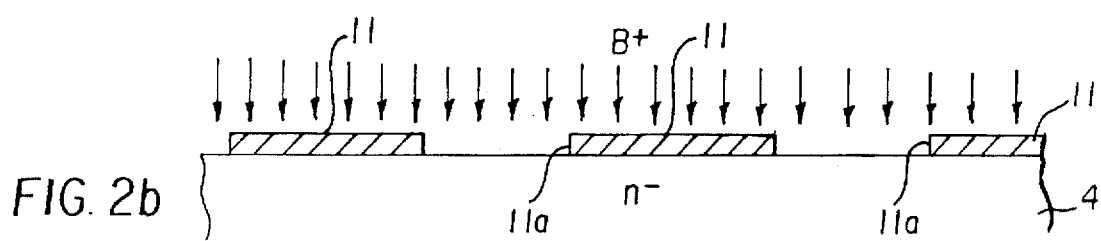
Figure 2C:
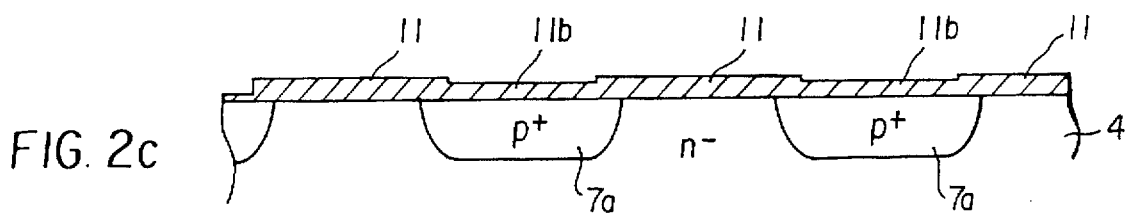
Figure 2D:
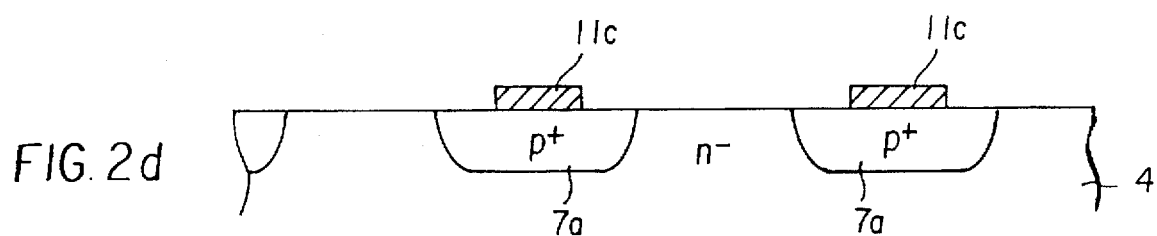
Figure 2E:
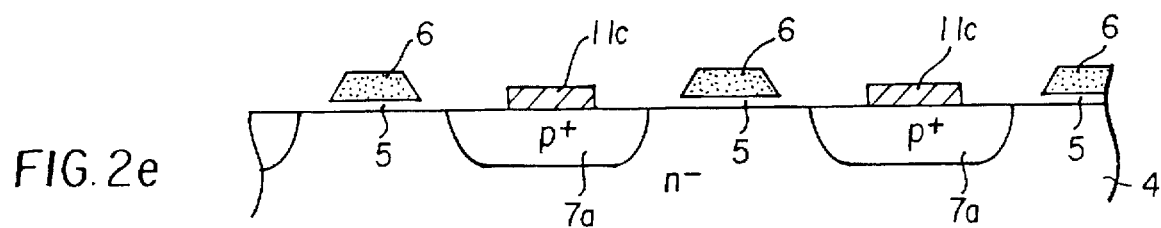

A method of manufacturing the IGBT semiconductor structure of the first embodiment will now be explained with reference to FIGS. 2(a)–2(e). Initially, the n$^+$-type buffer layer 3 is laminated on the p$^+$-type collector layer 2 to provide a semiconductor substrate 10, as shown in FIG. 2(a). The n$^-$-type conductivity modulation layer (n base) 4 is then epitaxially grown on the n$^+$-type buffer layer 3. Then, the initial oxidation process is effected, so that the surface of the n$^-$-type conductivity modulation layer 4 is covered with a thick silicon oxide film 11. Subsequently, openings 11a for forming the main emitter regions 7a are formed through the silicon oxide film 11 in a photolithographic process, as shown in FIG. 2(b). Thereafter, boron ions B$^+$ are implanted so as to dope acceptors. In the next step, the boron ions are driven into the n$^-$-type conductivity modulation layer 4, so as to form well-shaped p$^+$-type main emitter regions 7a, as shown in FIG. 2(c). Another oxidation process is then conducted so that the openings 11a are covered with thick silicon oxide films 11b. In the next step, a middle portion of each silicon oxide film 11b on the main emitter region 7a is left as an implant mask 11c while the remaining portions of the oxide films 11, 11b are removed in a photolithographic process, as shown in FIG. 2(d). After a gate oxidation process is conducted to form gate insulating films 5, as shown in FIG. 2(e), the gate electrodes 6 made of polysilicon are formed on portions between adjacent main emitter regions 7a, 7a by photolithography.

Figure 3A:
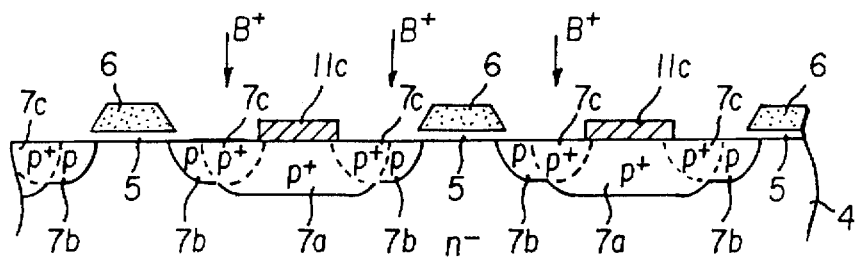
FIGS. 3(a)-3(d) are cross sectional views showing steps of manufacturing the semiconductor structure of the first embodiment, following the steps of FIGS. 2(a) to 2(e)
Figure 3B:
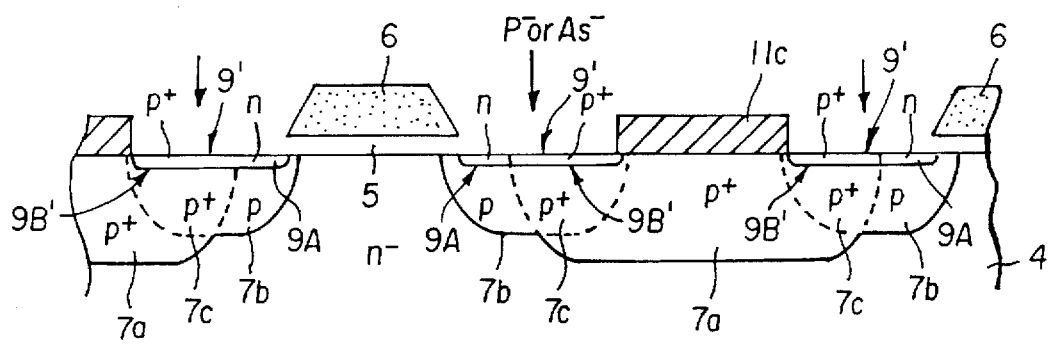

Referring now to FIGS. 3(a)–3(d), boron ions B$^+$ are implanted (channel doping) by self alignment using the silicon oxide films 11c and gate electrodes 6 as masks, so as to dope acceptors, as shown in FIG. 3(a). Thereafter, channel driving is conducted to diffuse p-type regions into small-depth end portions of the wells of the p$^+$-type main emitter regions 7a, so that the outer-contact emitter regions 7b are formed outside the well edges of the main emitter regions 7a. Since a portion of the diffused p-type region is located in the corresponding small-depth end portion of the well of the p$^+$-type main emitter region 7a, the main emitter region 7a is provided at its opposite ends with high-impurity-concentration (heavily doped) regions 7c of nearly p$^{++}$ type. In the next step as shown in FIG. 3(b), high concentration of phosphorus or arsenic ions are implanted as donors by self alignment using the silicon oxide films 11c and gate electrodes 6 as masks, to provide small-depth ntype source regions 9' in surface layers of the main emitter regions 7a and outer-contact emitter regions 7b. As a result, the n-type source region 9A is formed in the surface layer of each outer-contact emitter region 7b, while the p$^+$-type region 9B' is formed in the surface layer of each inner-contact emitter region 7c of the main emitter region 7a.

Figure 3C:
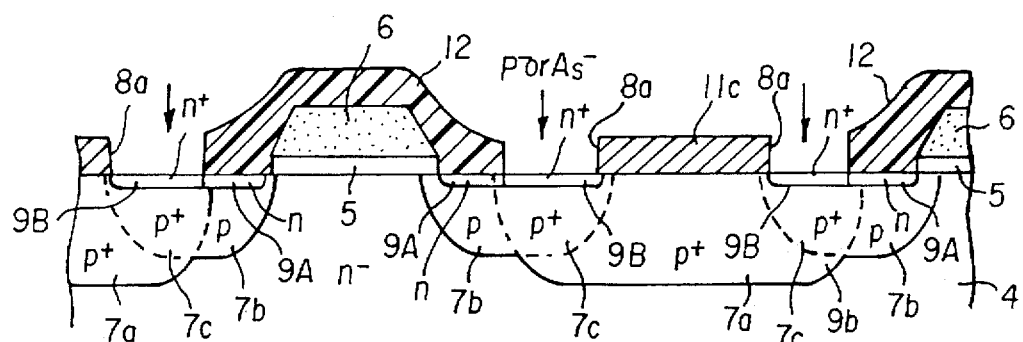
Figure 3D:
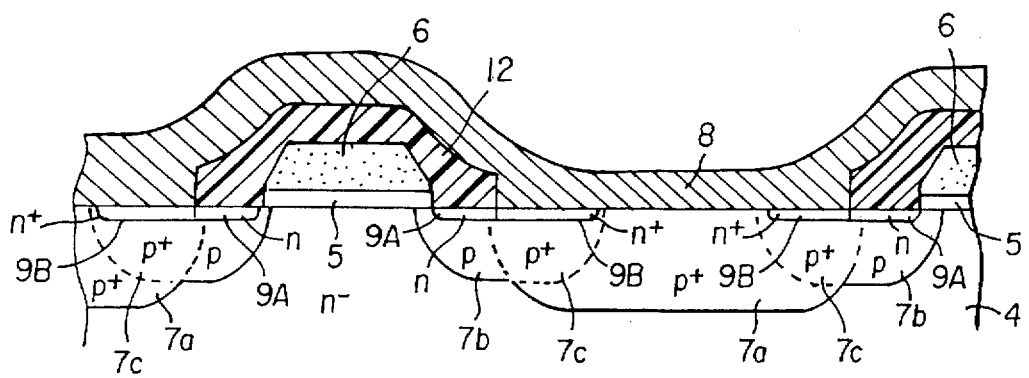

In the next step as shown in FIG. 3(c), phosphosilicate glass (PSG) layers 12 serving as inter-layer insulation films are formed on the gate electrodes 6 by photolithography to form contact holes 8a for the emitter electrode 8. The contact holes 8a are open exactly on the p$^+$-type regions 9B'. Thereafter, a high concentration of phosphorous or arsenic ions are implanted again as donors through the contact holes 8a, using the phosphosilicate glass layers 12 and silicon oxide films 11c as masks, so as to increase the concentration of the inner regions of the n-type source regions 9A, to thus form the n$^+$-type source contact regions 9B. The portions located right under the phosphosilicate glass layers 12 remain as the n-type source regions 9A. After the silicon oxide films 11c are removed by etching, the emitter electrode 8 made of aluminum is formed as shown in FIG. 3(d). The collector electrode 1 is also formed on the rear surface of the p$^+$-type collector layer 2.

In the above method for manufacturing the IGBT structure according to the present embodiment, the high-impurity-concentration source contact regions 9B can be obtained without increasing the concentration of the source regions 9A, merely by adding to the conventional method a step of doping n-type impurities through the contact holes 8a before forming the emitter electrode 8, using as masks the phosphorous glass layers 12 serving as the inter-layer insulating films. Further, in the present method, the high-impurity-concentration p$^+$-type inner-contact emitter regions 7c can be provided in addition to the p$^+$-type main emitter regions 7a, whereby the p base resistance $r_B$ can be remarkably reduced.

Second Embodiment

Figure 4:
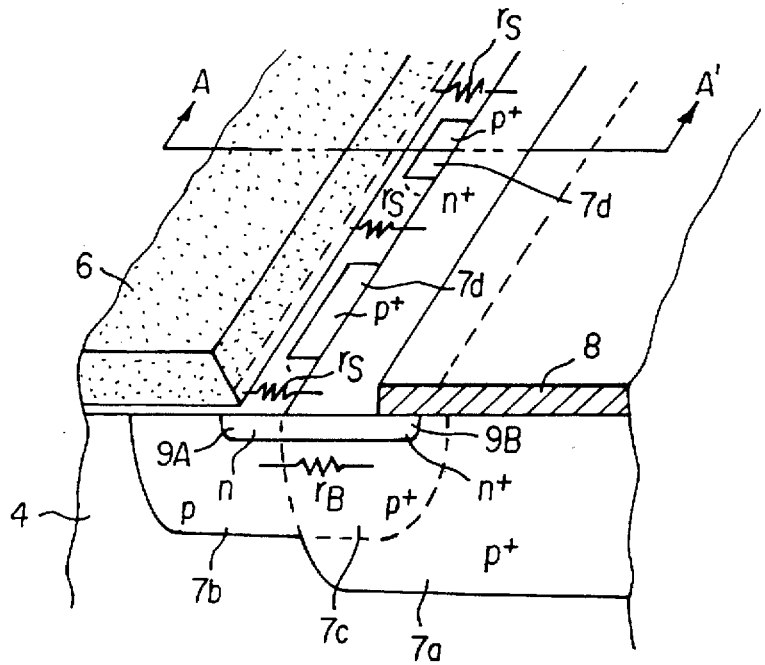
FIG. 4 is an enlarged perspective view showing an IGBT semiconductor structure according to the second embodiment of the present invention.
Figure 5:
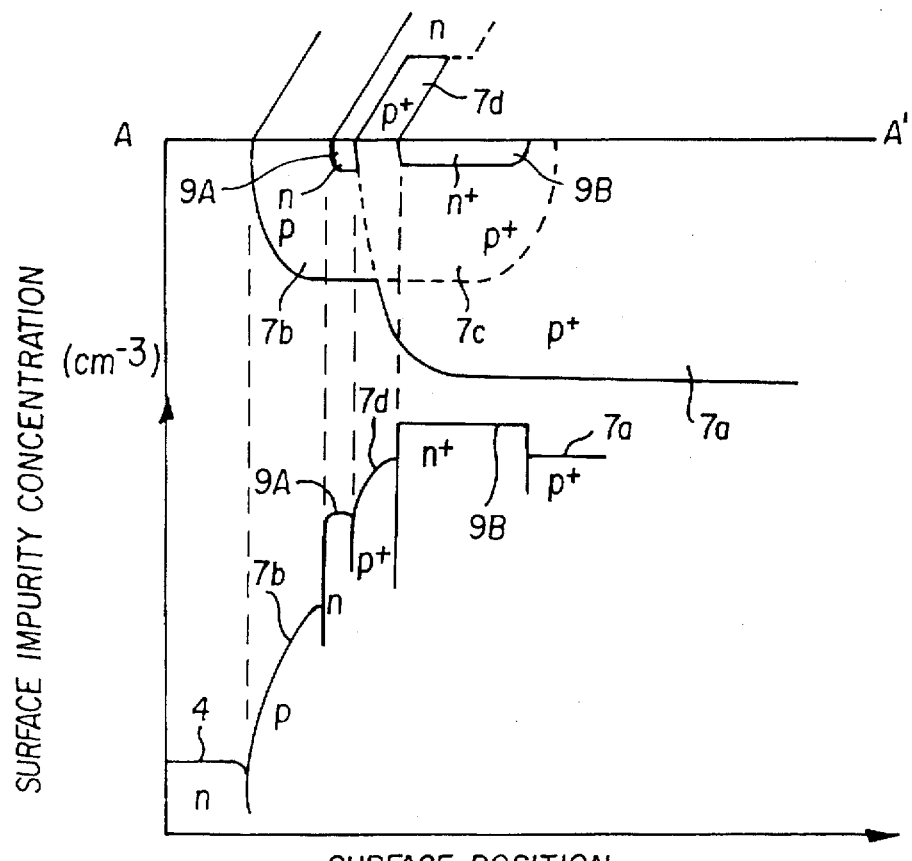
FIG. 5 is graph showing the relationship between the surface impurity concentration and the surface position as viewed in the cross section taken along line A–A' of FIG. 4.

FIG. 4 is an enlarged perspective view showing an IGBT semiconductor structure according to the second embodiment of the present invention. FIG. 5 is a graph showing the relationship between the surface position and the surface concentration in a cross section cut along the line A–A' of FIG. 4.

Similarly to the first embodiment, the IGBT semiconductor structure of the present embodiment includes the outer-contact emitter region 7b adjacently formed outside the surface of the main emitter region 7a, small-depth n-type source region 9A formed in the surface of the outer-contact emitter region 7b, and small-depth n$^+$-type source contact region 9B formed in the surface of the inner-contact emitter region 7c. The p$^+$-type main emitter region 7a has comb-shaped expanded portions 7d which extend through the interface between the n-type source region 9A and the n$^+$-type source contact region 9B up to the surface of these regions 9A, 9B. Thus, the n-type source region 9A is provided with narrowed portions interposed between the expanded portions 7d, and the diffusion resistance $r_s$ exists as parasitic elements in these narrowed portions. Since the portion of the n-source region 9A located right under the gate electrode 6 extends over the entire width of the electrode, a whole-width channel is provided right under the gate electrode 6 when a positive potential is applied to the electrode 6, assuring substantially the same channel resistance as that of the first embodiment.

In the above-described structure, even if the potential of the outer-contact emitter region 7b is increased due to the voltage drop of the base resistance rB caused by hole current when excess current flows upon load short-circuiting, for example, the voltage of the n-type source region 9A also increases as compared with the voltage of the emitter electrode 8, due to the voltage drop of the diffusion resistance $r_s$ caused by electron current. As a result, the pn junction between the n-type source region 9A and the p-type outer-contact emitter region 7b is even less likely to forward-biased, as compared with the first embodiment, thus assuring increased ability to prevent latch-up. While no excess current flows in the normal on condition of the IGBT, however, the diffusion resistance $r_s$ is added as the ON-state voltage, resulting in an increase in the ON-state resistance compared to that of the first embodiment.

A method for manufacturing the IGBT semiconductor structure of the second embodiment will be explained.

Figure 6A:
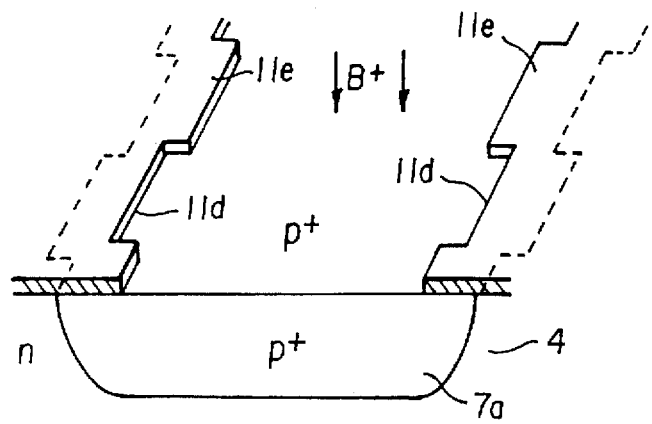
FIGS. 6(a)-6(c) are perspective views showing steps of manufacturing the semiconductor structure of the second embodiment.

As in the method for manufacturing the structure of the first embodiment, the $n^+$-type buffer layer 3 is laminated on the $p^+$-type collector layer 2 to provide a semiconductor substrate 10, as shown in FIG. 2(a). The $n^-$-type conductivity modulation layer (n base) 4 is then epitaxially grown on the $n^{3o}$ -type buffer layer 3. Then, the initial oxidation process is conducted so that the surface of the $n^-$-type conductivity modulation layer 4 is covered with a thick silicon oxide film 11. Subsequently, a mask 11e having an opening 11d for forming the main emitter region 7a is formed from the silicon oxide film 11 by photolithography, as shown in FIG. 6(a). This opening 11a has opposite edges each having rectangular recesses. Then, boron ions $B^+$ are implanted so as to dope acceptors, and then driven into the $n^-$-type conductivity modulation layer 4 so as to form the well-shaped $p^+$-type main emitter region 7a. With the edges of the mask II e having the rectangular recesses, the main emitter region 7a has rectangularly protruding portions that are spaced along the edges of the well. Another oxidation process is then conducted, to cover the opening 11d with a thick silicon oxide film.

Figure 6B:
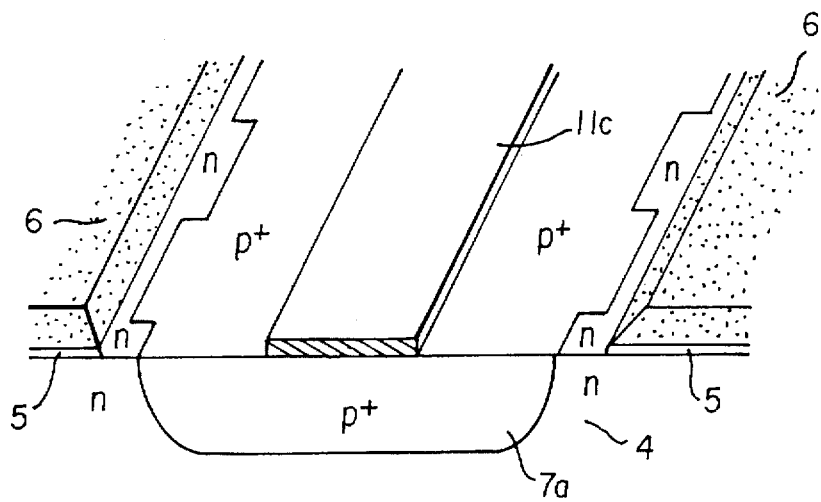

In the next step, a middle portion of the silicon oxide film on the main emitter region 7a is left as an implant mask 11c while the remaining portion is removed by photolithography. After a gate oxidation process is conducted to form the gate insulating layers 5, as shown in FIG. 6(b), the gate electrodes 6 made of polysilicon are formed on portions between adjacent main emitter regions 7a, 7a by photolithography.

Figure 6C:
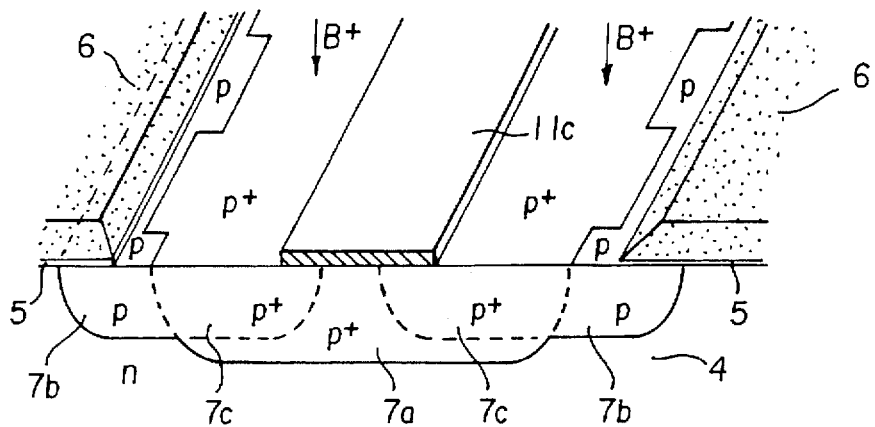

In the next step as shown in FIG. 6(c), boron ions $B^+$ are implanted (channel doping) by self alignment using the silicon oxide film 11c and gate electrodes 6 as masks, to thus dope acceptors. Thereafter, channel driving is conducted so as to diffuse p-type regions into small-depth end portions of the well of the $p^+$-type main emitter region 7a, so that the outer-contact emitter regions 7b are formed outside the well edges of the main emitter region 7a. Since parts of the diffused p-type regions are located in the respective small-depth end portions of the well of the $p^+$-type main emitter region 7a, the main emitter region 7a is provided with inner-contact emitter regions 7c that are heavily-doped regions of nearly $p^{++}$ type.

Figure 7A:
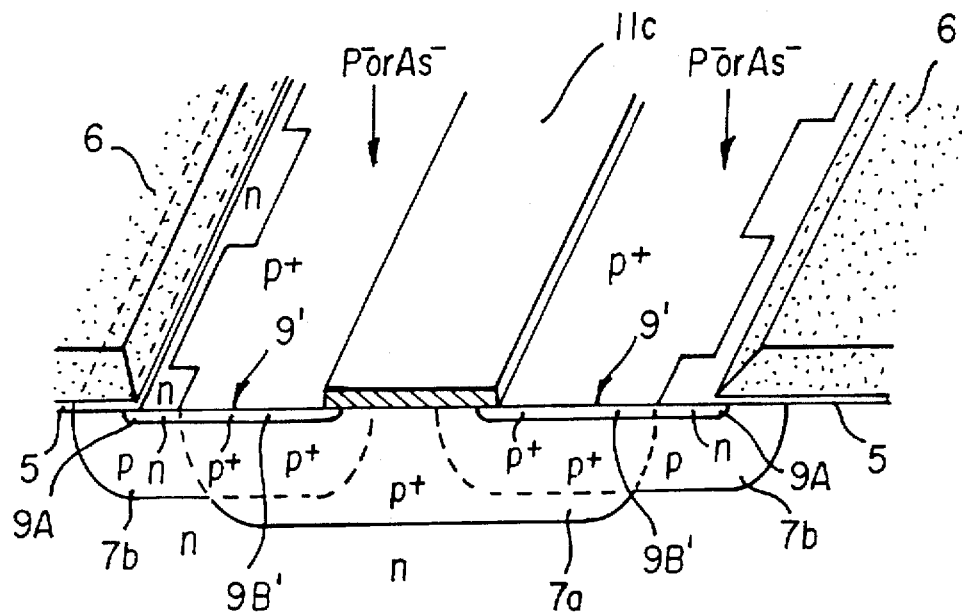
FIGS. 7(a) and 7(b) are perspective views showing steps of manufacturing the semiconductor structure of the second embodiment, following the steps of FIGS. 6(a) to 6(c)

In the next step as shown in FIG. 7(a), a high concentration of phosphorous or arsenic ions are implanted as donors by self alignment using the silicon oxide film 11c and gate electrodes 6 as masks, to form small-depth n-type source regions 9' in surface layers of the main emitter region 7a and outer-contact emitter regions 7b. As a result, the n-type source regions 9A are formed in the surface layers of the outer-contact emitter regions 7b, while the $p^+$-type regions 9B' are formed in the surface layers of the inner-contact emitter regions 7c of the main emitter region 7a.

Figure 7B:
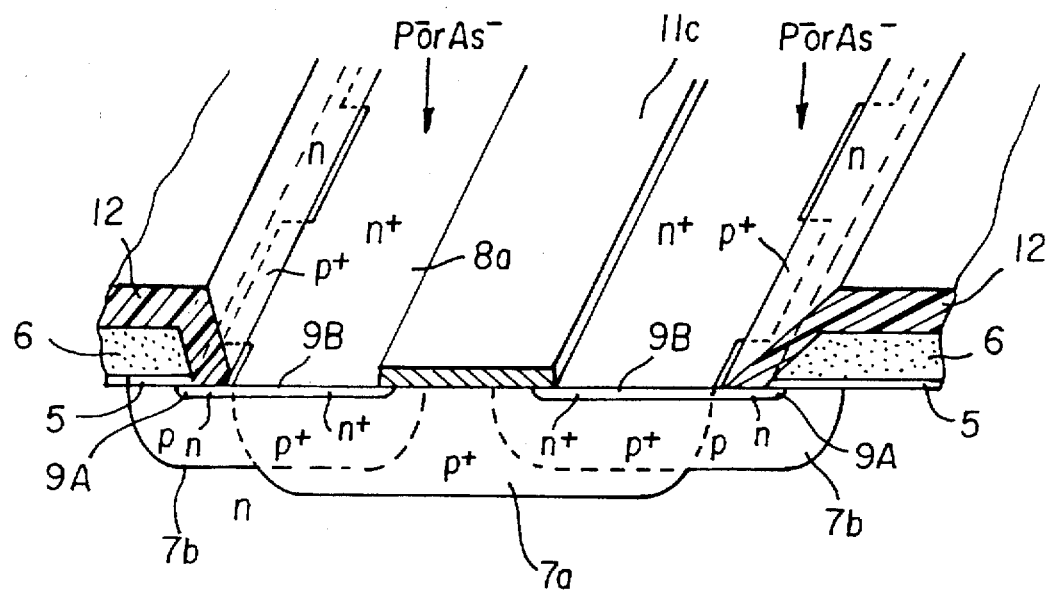

In the next step as shown in FIG. 7(b), phosphosilicate glass (PSG) layers 12 serving as inter-layer insulation films are formed on the gate electrodes 6 by photolithography, to form contact holes 8a for forming the emitter electrode 8. The contact holes 8a are open exactly on the $p^+$-type regions 9B'. The end portions of the phosphosilicate glass layers 12 defining the contact holes 8a extend over the pn junctions formed between alternately arranged n and $p^+$ regions. Thereafter, a high concentration of phosphorous or arsenic ions are implanted again as donors through the contact holes 8a, using the phosphorous glass layers 12 and silicon oxide film 11c as masks, so as to increase the concentration of the inner regions of the n-type source regions 9 to thus form the $n^+$-type source contact regions 9B. The portions of the source regions 9 located right under the phosphorous glass layers 12 remain as the n-type source regions 9A. After the silicon oxide film 11c is removed by etching, the emitter electrode 8 made of aluminum is formed, as shown in FIG. 4. The collector electrode 1 is also formed on the rear surface of the $p^+$-type collector layer 2, as shown in FIG. 1.

Third Embodiment

Figure 8A:
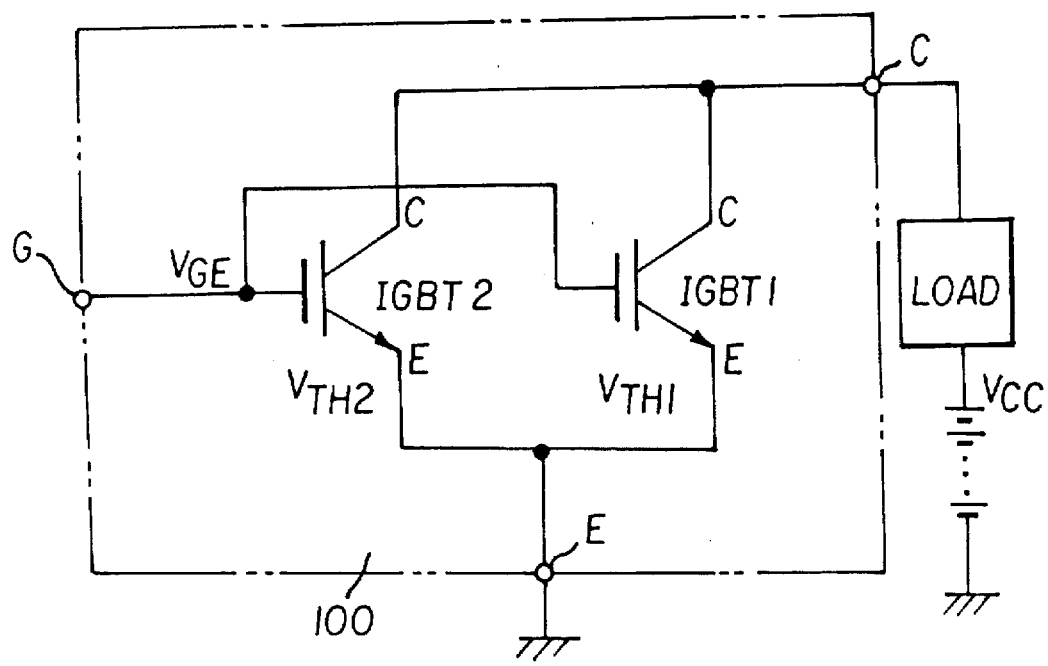
FIG. 8(a) is a circuit diagram showing a circuit arrangement of IGBT according to the third embodiment of the present invention.
Figure 8B:
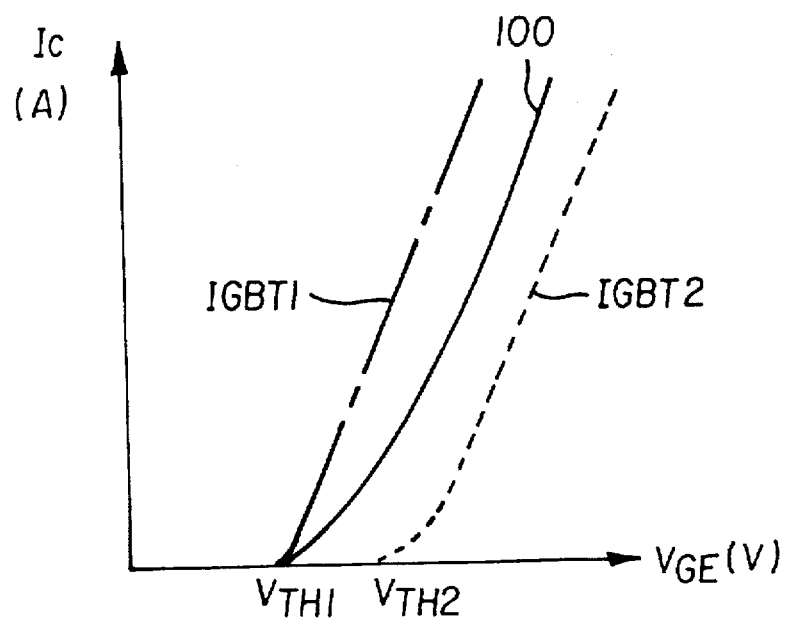
FIG. 8(b) is a graph showing the relationship between collector saturation current and emitter-gate voltage of the IGBT.

FIG. 8(a) is a circuit diagram showing the circuit construction of IGBT according to the third embodiment of the present invention. FIG. 8(b) is a graph showing the relationship between the emitters-gate voltage and the collector saturation current.

The IGBT 100 of the present embodiment is a composite IGBT in which a pnp-type first IGBT 1 having a low threshold voltage $V_{TH1}$ and a pnp-type second IGBT 2 having a high threshold voltage $V_{TH2}$. The threshold voltage $V_{TH2}$ of the second IGBT 2 is set to be higher than the threshold voltage $V_{TH1}$ of the first IGBT 1, so that a difference between these threshold voltages $V_{TH1}$ and $V_{TH2}$ is on the order of 1V, which is much greater than a range of ±0.3V of errors between these threshold voltages encountered in a normal process. For example, the lower threshold value VTHI is set to 4V, while the higher threshold value $V_{TH2}$ is set to 8V.

In the present embodiment, the device size of the first IGBT 1 is made substantially equivalent to that of the second IGBT 2. Thus, as shown in FIG. 8(b), the composite IGBT 100 of the present embodiment has a characteristic (solid line) of the collector saturation current Ic with respect to the emitter-gate voltage $V_{GE}$, which is intermediate between the characteristic (one-dot chain line) of the first IGBT 1 with the lower threshold voltage $V_{TH1}$ and that (broken line) of the second IGBT 2 with the higher threshold voltage $V_{TH2}$.

Generally, in an integrated circuit into which are built only the first IGBTs 1 having a low threshold voltage $V_{TH1}$ (4V), a gate voltage $V_{GE}$ (of 15V, for example) which is considerably higher than the threshold voltage $V_{TH1}$ is applied to the gate electrode. If voltage equivalent to the supply to voltage $V_{CC}$ is applied between the emitter and collector upon load short-circuiting, therefore, excess current flows through the first IGBT 1 with a result of breakdown. In an integrated circuit into which are built only the second IGBT 2 having a high threshold voltage $V_{TH2}$ (8V), on the other hand, the ON-state voltage (collector saturation voltage) becomes high due to a small margin between the threshold voltage $V_{TH2}$ and the gate voltage applied in normal switch-on operations. Thus, the integrated circuit of this type is not suitable for switching operations.

In the composite IGBT 100 of the present embodiment, on the other hand, the threshold voltage coincides with the threshold voltage $V_{TH1}$, and normal switch-on/off operations can be thus accomplished without any problem as in the first IGBT 1, and the ON-state voltage does not increase. Further, the current value of the collector saturation current $I_c$ of the composite IGBT 100 is lower than that of the first IGBT upon load short-circuiting. Thus, the composite IGBT 100 shows improved capability to withstand load short-circuiting.

Figure 9:
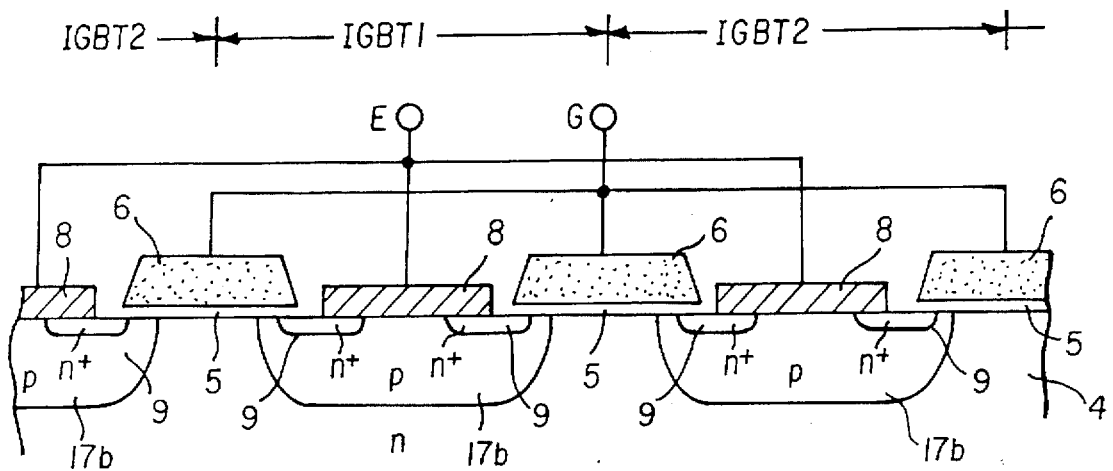
FIG. 9 is a cross sectional view showing the first semiconductor structure which provides the composite IGBT of FIG. 8(a)

FIG. 9 is a cross sectional view showing the first semiconductor structure which provides the composite IGBT 100 of FIG. 8(a). This semiconductor structure includes p-type, low-impurity-concentration emitter layers 17a in the form of wells formed in the surface of an n⁻-type conductivity modulation layer (n base) 4, and p-type, high-impurity-concentration emitter layers 17b in the form of wells formed in the surface of the conductivity modulation layer 4. Since the emitter layer 17a has a lower surface impurity concentration than the emitter layer 17b, each portion of the structure including the emitter layer 17a provides the IGBT 1 having the low threshold voltage V$TH1$, and each portion including the emitter layer 17b provides the IGBT 2 having the high threshold voltage V$_{TH2}$. Thus, the threshold voltage of the IGBT differs between two adjacent p-type wells.

Figure 10:
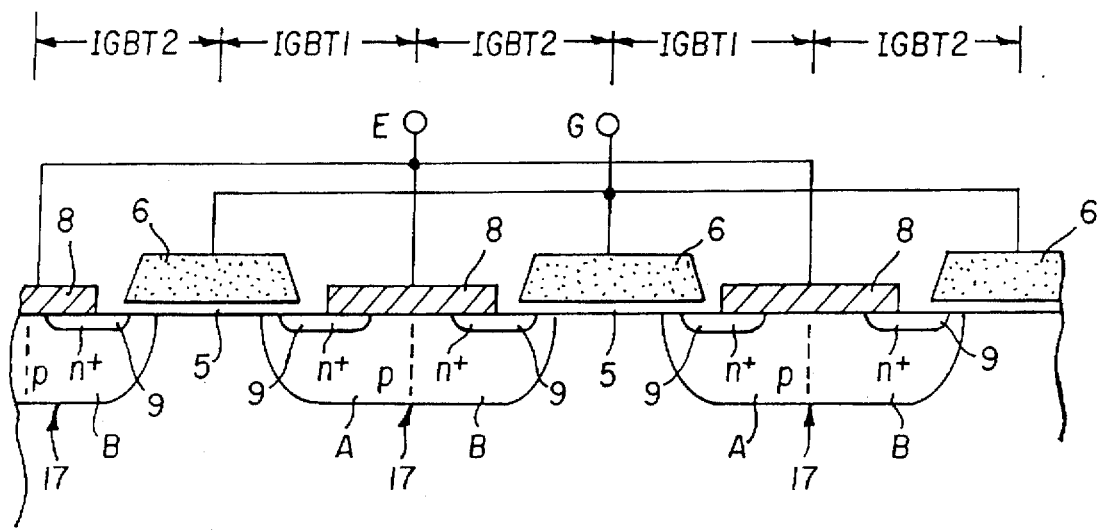
FIG. 10 is a cross sectional view showing the second semiconductor structure which provides the composite IGBT of FIG. 8(a)

FIG. 10 is a cross sectional view showing the second semiconductor structure that provides the composite IGBT 100 of FIG. 8(a). In this semiconductor structure, one half (region A) of each p-type emitter layer (well) 17 is formed with a low impurity concentration, and the other half (region B) is formed with a high impurity concentration. Thus, each portion of the structure including the region A provides the IGBT 1 having the low threshold voltage V$_{TH1}$, and each portion of the structure including the region B provides the IGBT 2 having the high threshold voltage V$_{TH2}$.

Figure 11:
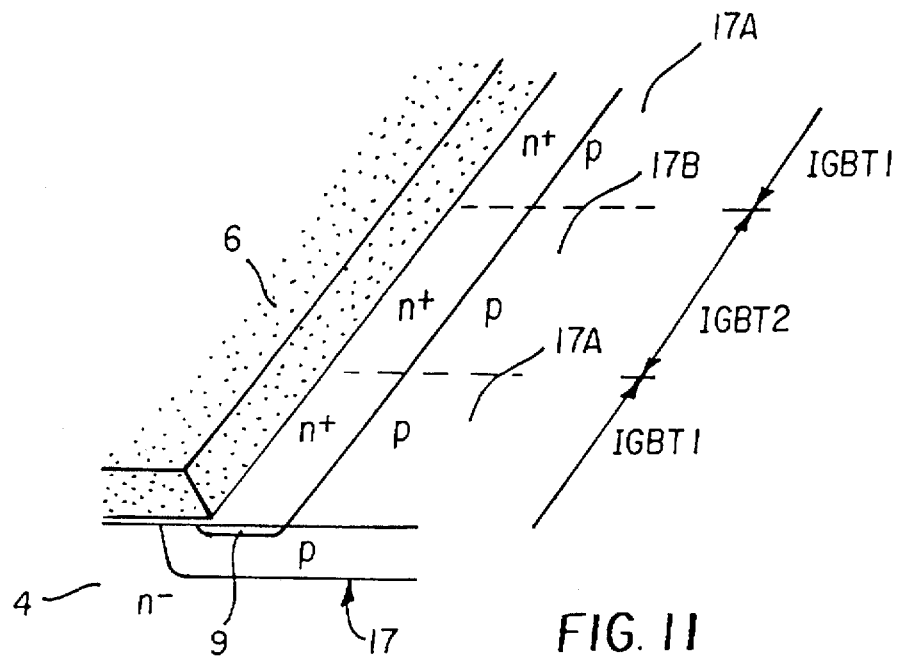
FIG. 11 is a cross sectional view showing the third semiconductor structure which provides the composite IGBT of FIG. 8(a)

FIG. 11 is a cross sectional view showing the third semiconductor structure which provides the composite IGBT 100 of FIG. 8(a). This semiconductor structure includes p-type emitter layers (wells) 17 in the form of planar stripes formed in the surface of the n⁺-type conductivity modulation layer (n base) 4. Each emitter layer 17 has p-type low-concentration regions 1 7A and p-type high-concentration regions 17B that are alternately arranged in the longitudinal direction of the stripe-like layer 17. Each portion of the structure including the p-type low-concentration region 17A provides the IGBT 1 having the low threshold voltage V$_{TH1}$, and each portion including the p-type high-concentration region 1 7B provides the IGBT 2 having the high threshold voltage V$_{TH2}$.

Figure 12A:
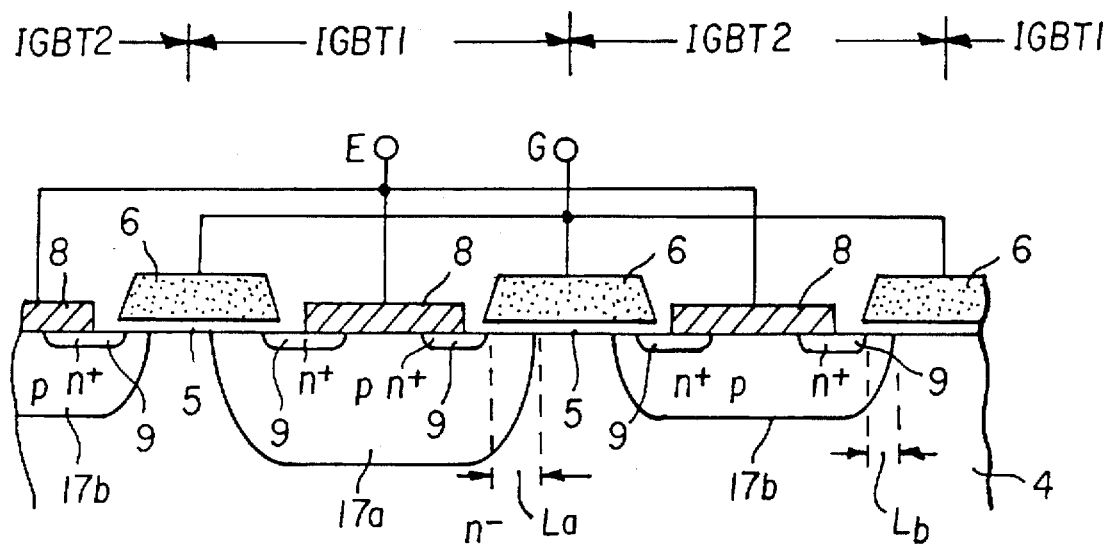
FIG. 12(a) is a cross sectional view showing another semiconductor structure which provides the composite IGBT.
Figure 12B:
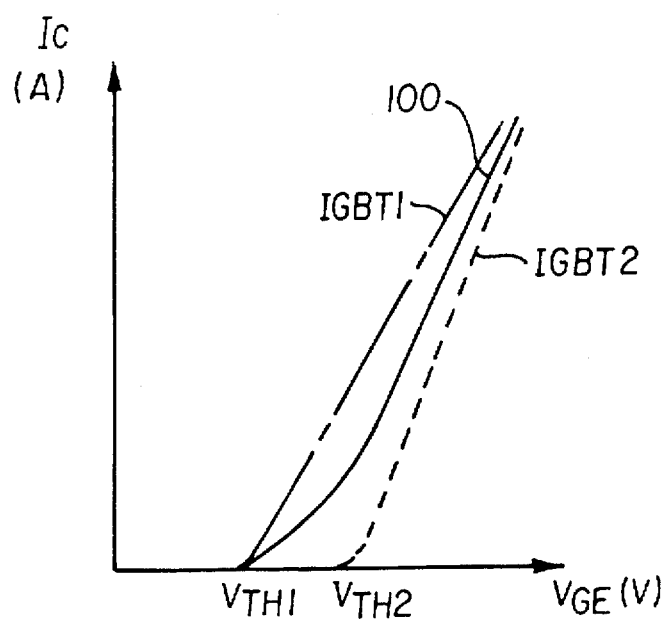
FIG. 12(b) is a graph showing the relationship between collector saturation current and emitter-gate voltage of the structure of FIG. 12(a)

FIG. 12(a) is a cross sectional view showing another semiconductor structure that realizes the composite IGBT 100. FIG. 12(b) is a graph showing the relationship between the collector saturation current and the emitter-gate voltage in the semiconductor structure of FIG. 12(a). This semiconductor structure includes p-type, low-impurity-concentration emitter layers 1 7a in the form of wells formed in the surface of the n⁻-type conductivity modulation layer (n base) 4, and p-type, high-impurity-concentration emitter layers 17b in the form of wells formed in the surface of the conductivity modulation layer 4. The channel length L$_a$ in the emitter layer 17a is made longer than the channel length L$_b$ in the emitter layer 17b. Since the surface concentration of the emitter layer 17a is lower than that of the emitter layer 17b, each portion of the structure including the emitter layer 17a provides the IGBT 1 having the low threshold voltage V$_{TH1}$, and each portion including the emitter layer 17b provides the IGBT 2 having the high threshold voltage V$_{TH2}$. In this case, however, the ON-state resistance of the IGBT 1 is larger than that of the IGBT 2 since the channel length L$_a$ of the IGBT 1 is greater than the channel length L$_b$ of the IGBT 2. Accordingly, the transconductance (g=ΔI$_c$/ΔV$_{GE}$) of the IGBT 1 is smaller than that of the IGBT 2, as shown in FIG. 12(b), and therefore the composite IGBT 100 of FIG. 12 can more effectively suppress excess current upon load shortcircuiting as compared with the semiconductor structures shown in FIGS. 9–11.

Fourth Embodiment

Figure 13:
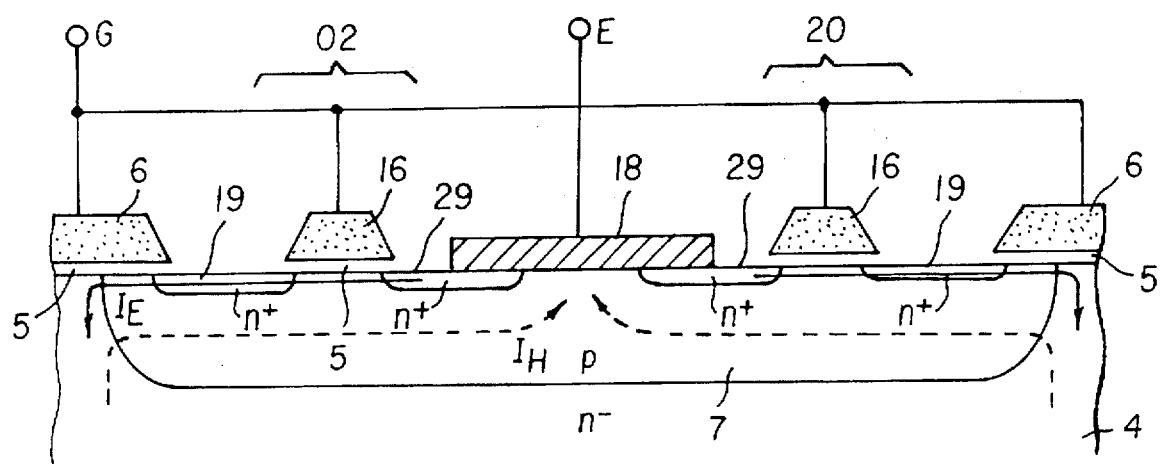
FIG. 13 is a cross sectional view showing a semiconductor structure of IGBT according to the fourth embodiment of the present invention.

FIG. 13 is a cross sectional view showing a semiconductor structure of IGBT according to the fourth embodiment of the present invention. The semiconductor structure of the present embodiment includes a p-type emitter layer (p base) 7 formed as a well in the surface of the conductivity modulation layer (n base) 4, and first gate electrodes 6 and second gate electrodes 16 made of polysilicon and formed on the conductivity modulation layer 4 through gate insulating films 5. The structure further includes n⁺-type source regions 19 and n⁺-typ source contact layers 29 which are formed as wells in the surface of the emitter layer (p base) 7 by self alignment using the gate electrodes 6, 16 as masks, and an emitter electrode 18 made of aluminum and held in ohmic contact with both the n⁺-type source regions 29 and emitter layer 7. Each of the second gate electrodes 16 is formed so as to overlap the corresponding source region 19 and source contact layer 29, to thus provide a switching lateral MOSFET 20 wherein the source region 19 serves as a drain, and the source contact layer 29 serves as a source.

When the IGBT is turned on with a positive potential applied to the first gate electrode 6 and the second gate electrode 16, the switching lateral MOSFET 20 is turned on so that electron current I$_E$ flows through an n channel of the switching lateral MOSFET 20. If load short-circuiting occurs, the switching lateral MOSFET 20 operates in a saturation region (non-linear region) in which the electron current I$_E$ is limited by the saturation current, and therefore excess current is unlikely to flow. Since this state is equivalent to occurrence of high channel resistance, the potential of the source region 19 is increased to be higher than the potential of the emitter electrode 18, and the pn junction between the source region 19 and the emitter layer 7 is less likely to be forward-biased, thus assuring high ability to prevent latch-up.

When the IGBT is in the OFF state, the n-channel of the switching lateral MOSFET 20 disappears, and the conductance between the source region 19 and the source contact layer 29 is interrupted, whereby the source region 19 is held in the floating condition. In the DMOS structure of the conventional IGBT as shown in FIG. 16, when the potential of the first gate electrode 6 is dropped to be lower than the threshold voltage upon turn-off, the electron current is sharply reduced due to disappearance of a channel of DMOS, and latch-up may occur during a rapid increase in the emitter-collector voltage, with the pn junction between the source region 9 and the emitter layer 7 being forward biased due to an increase in a hole current component.

In the present embodiment, however, the source region 19 is not grounded but brought into the floating condition upon turn-off, and thus latch-up does not occur even with the above pn junction being forward biased.

Figure 14A:
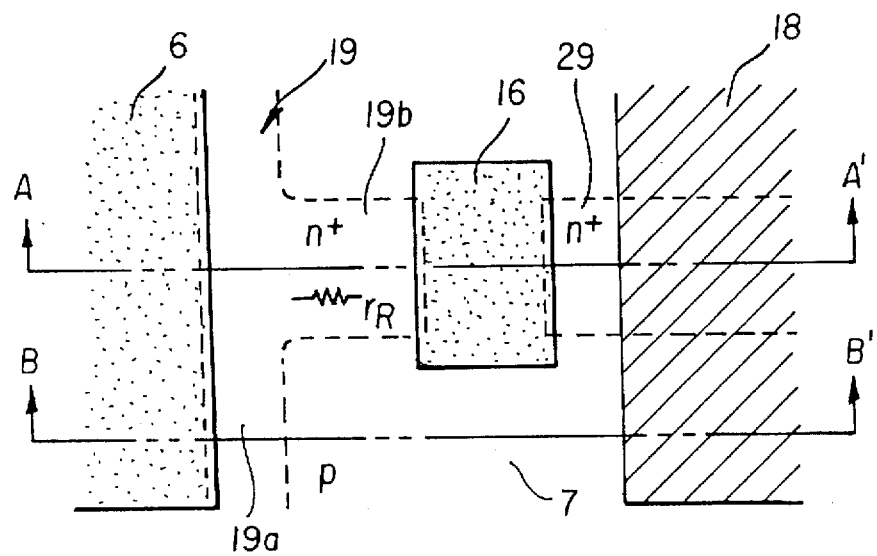
FIG. 14(a) is plan view showing a planar pattern that realizes the semiconductor structure of FIG. 13.
Figure 14B:
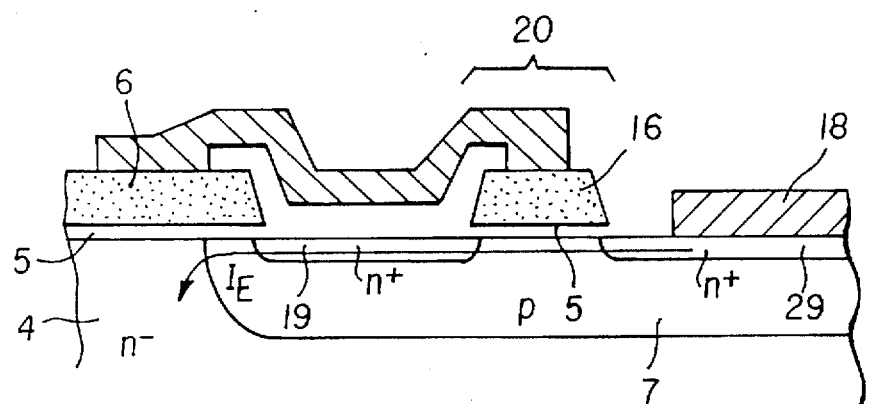
FIG. 14(b) is ross sectional view taken along line A–A' of FIG. 14(a)
Figure 14C:
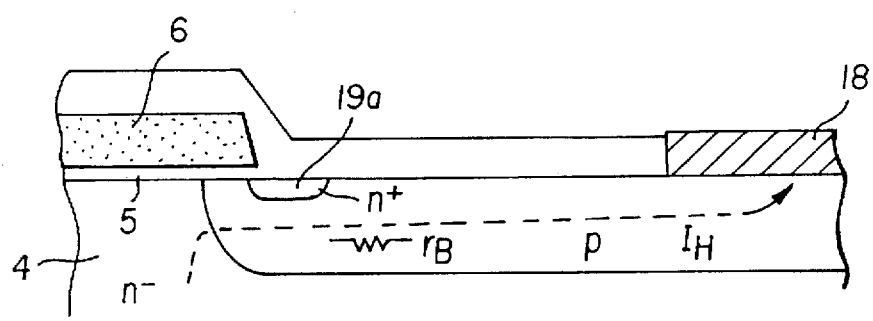
FIG. 14(c) is a cross sectional view taken along line B–B' of FIG. 14(a)

FIG. 14(a) shows a planar pattern of the semiconductor structure of FIG. 13. FIG. 14(b) is a cross sectional view taken along line A–A' of FIG. 14(a), and FIG. 14(c) is a cross sectional view taken along line B–B' of FIG. 14(a). The n⁺-type source region 19 consists of a channel-width equivalent portion 19a located right under the edge of the strip gate electrode 6, and a small-width portion 19b which protrudes from the channel-width equivalent portion 19a (channel width is the vertical dimension as seen in FIG. 14(a). The n⁺-type source contact layer 29 having a small width is located under the emitter electrode 18, to be aligned with the small-width portion 19b of the source region 19. The second gate electrode 16 having a rectangular shape with a smaller width than the gate electrode 6 overlaps the small-width portion 19b and the source contact layer 29. In this arrangement, the diffusion resistance rs exists as a parasitic element in the small-width portion 19b, as well as the channel resistance rc of the switching lateral MOSFET 20. This leads to improved capability to withstand load short-circuiting.

Figure 15A:
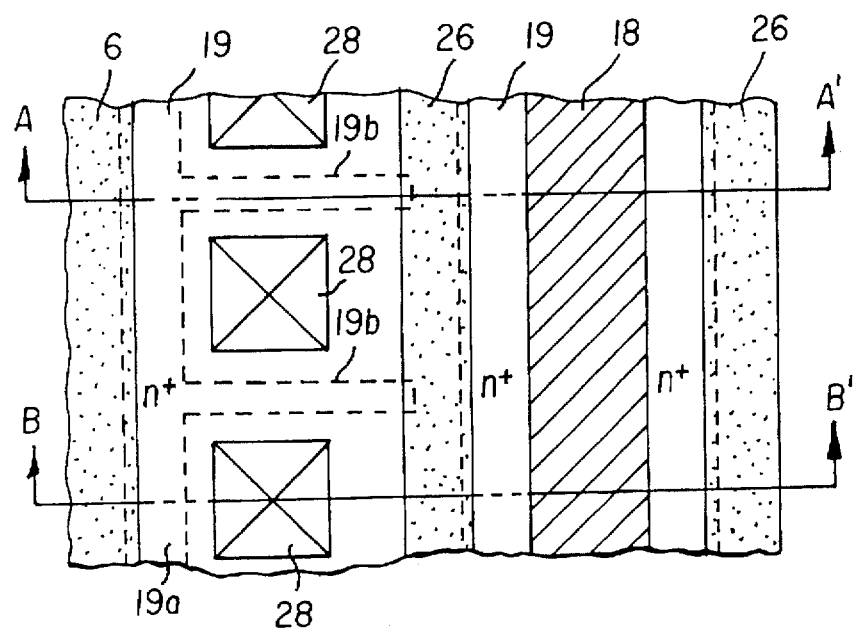
FIG. 15(a) is a plan view showing a planar pattern of a structure as an improvement of the structure of FIG. 14.
Figure 15B:
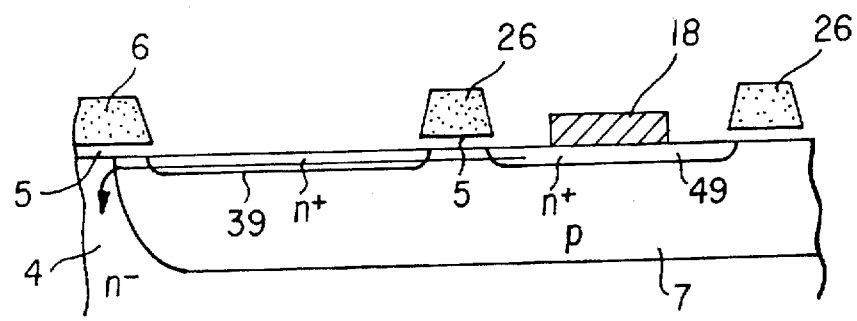
FIG. 15(b) is cross sectional view taken along line A–A' of FIG. 15(a)
Figure 15C:
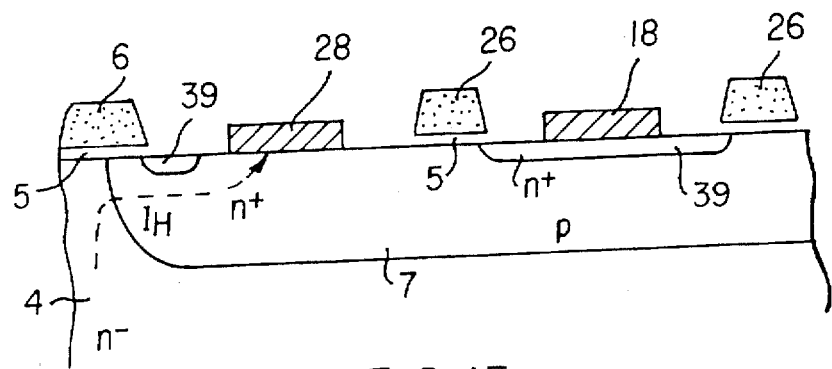
FIG. 15(c) is a cross sectional view taken along line B–B' of FIG. 15(a)

FIG. 15(a) shows a planar pattern of an improvement of the structure shown in FIG. 14, FIG. 15(b) is a cross sectional view taken along line A–A' of FIG. 15(a), and FIG. 15(c) is a cross sectional view taken along line B–B' of FIG. 15(a). In the structure of FIG. 14 in which the second gate electrode 16 is provided, the diffusion resistance $r_B$ in the path of hole current $I_H$ is increased due to an increased distance between the source region 19 as a source for injecting the electron current $I_E$ and the emitter electrode 18 for collecting the hole current $I_H$. Therefore, the diffusion resistance $r_B$ needs to be further lowered. In the semiconductor structure of the present embodiment, second emitter electrodes 28 are provided for collecting only the hole current $I_H$, so that the first emitter electrode 18 serves as a source for injecting only the electron current $I_E$. The second emitter electrodes 28 are disposed between adjacent small-width portions 1 9b of the source region 19. A second gate electrode 26 is formed in the shape of a strip, and an $n^+$-type source contact layer 39 is also formed in the shape of a strip to extend in parallel with the electrode 26. Since the second to emitter electrodes 28 are formed adjacent to the source region 19, the length of the path of the hole current $I_H$ in the emitter layer 7 is reduced, and the diffusion resistance $r_B$ is lowered, thereby assuring further improved capability to withstand load short-circuiting.

While the illustrated embodiments are concerned with pnp-type IGBT, npn-type IGBT according to the present invention may be easily provided by inverting the conductivity type.

As explained above, the present invention yields the following effects.

1) In the first structural arrangement of the present invention, the second-conductivity-type source region has a non-uniform impurity concentration, and consists of a high-impurity-concentration source contact region and a source region having a lower impurity concentration than the source contact region. The resultant IGBT exhibits improved ability to prevent latch-up, and improved capability to withstand breakdown upon load short-circuiting. With the high-concentration source contact region being attached or connected to the source region, the contact resistance is not increased, and the low ON-state voltage can be maintained.

2) In the structure wherein the first-conductivity-type emitter layer has the first-conductivity-type main emitter region (well) having a high impurity concentration, and the first-conductivity-type outer-contact emitter region (well) formed adjacent to a well edge of the main emitter region to be located outside its small-depth portion, the diffusion resistance value of the portion right under the source contact region is reduced due to the increased impurity concentration of the main emitter region, without incurring variations in the threshold voltage of the MOS portion. Therefore, the ability to prevent latch-up is improved.

3) In the structure provided with the first-conductivity-type inner-contact emitter region having a higher impurity concentration than the main emitter region, the diffusion resistance value is further reduced, assuring further improved ability to prevent latch-up.

4) In the structure provided with the first-conductivity-type comb-shaped expanded portion which extends from the main emitter region to the surface of the connected portion of the source region and source contact region, the voltage of the source region is increased with a voltage drop due to the diffusion resistance in the narrowed portions of the source region, whereby the ability to prevent latch-up can be increased.

5) In the circuit arrangement of the present invention, the threshold voltage of the composite IGBT is made equal to the low threshold voltage of the first IGBT, so that normal switch-on/off operations can be effected without any problem, and the ON-state voltage is not increased. Upon short-circuiting of a load, the value of the collector saturation current of the composite IGBT is made lower than that of the first IGBT 1, whereby the capability to withstand load short-circuiting is improved.

6) In the structure wherein the ON-state resistance of the first IGBT is set to be higher than that of the second IGBT, the transconductance of the IGBT I is smaller than that of the IGBT 2, thereby enabling the composite IGBT to suppress the excess current upon load short-circuiting.

7) In the second structural arrangement of the present invention, the lateral MOSFET consisting of the source contact layer, source region and second gate electrode operates in a saturated region (non-linear region) when load short-circuiting occurs, and the current is limited by the saturation current. In this arrangement, the excess current is less likely to flow, thus assuring improved ability to prevent latch-up. Since the lateral MOSFET is turned off upon turn-off of the IGBT, the source region is not connected to the emitter electrode and brought into the floating condition. This makes it possible to prevent latch-up which would otherwise be likely to occur upon turn-off.

8) In the structure provided with the second emitter electrode held in ohmic contact with the surface of the well edge portion of the emitter layer, the current flows into the second emitter electrode through a shorter path in the emitter layer, whereby the diffusion resistance value is lowered, and the capability to withstand load short-circuiting can be further improved.

What is claimed is:

1. A semiconductor device comprising:
a first-conductivity-type collector layer having a rear surface on which a collector electrode is formed;
a second-conductivity-type buffer layer laminated on said collector layer;
a second-conductivity-type conductivity modulation layer formed on said buffer layer;
a first-conductivity-type emitter layer formed as a well in a surface of said conductivity modulation layer;
a second-conductivity-type source region formed in a surface of a well edge portion of said emitter layer;
a gate electrode formed on a gate insulating film to overlap said source region and said conductivity modulation layer; and
an emitter electrode that is in ohmic contact with both said emitter layer and said source region;
wherein said second-conductivity-type source region includes a second-coductivity-type source region formed in the well edge of said emitter layer, and a second-conductivity-type source contact region formed adjacent to the source region and held in ohmic contact with said emitter electrode, said source contact region having a higher impurity concentration than said
wherein said first-coductivity-type emitter layer includes a first-conductivity-type high-impurity-concentration main emitter region in the form of a well, and a first-conductivity-type outer-contact emitter region in the form of a well, which is formed adjacent to a well edge of said main emitter region and is located outside of the main emitter region at a smaller depth; and
wherein said main emitter region includes a first-conductivity-type comb-shaped expanded potions which extend from the main emitter region to a surface of said source region through an interface of said source region and said source contact region.

2. A semiconductor device, including a first-conductivity-type first insulated gate bipolar transistor (IGBT) and a first-conductivity-type second IGBT, each of said first and second IGBT comprising:

a first-conductivity-type collector layer having a rear surface on which a collector electrode is formed;

a second-conductivity-type buffer layer laminated on said collector layer;

a second-conductivity-type conductivity modulation layer formed on said buffer layer;

a first-conductivity-type emitter layer formed as a well in a surface of said conductivity modulation layer;

a second-conductivity-type source region formed in a surface of a well edge portion of said emitter layer;

a gate electrode formed on a gate insulating film to overlap said source region and said conductivity modulation layer; and an emitter electrode that is in ohmic contact with both said emitter layer and said source region;

wherein the first-conductivity-type second IGBT is connected to said first IGBT in parallel to provide a monolithic structure, and in which current is controlled by said gate electrode, said second IGBT having a threshold voltage $V_{TH2}$ that is higher on the order of 1 volt than a threshold voltage $V_{TH1}$ of said first IGBT.

3. A semiconductor device as defined in claim 2, wherein said first IGBT has an ON-state resistance that is higher than an ON-state resistance of said second IGBT.

4. A semiconductor device as claimed in claim 2, wherein the emitter layer of said first IGBT has a different impurity than the emitter layer of said second IGBT.

5. A semiconductor den ice as claimed in claim 2, wherein a channel length of the first IGBT is different than a channel length of the second IGBT.

6. A semiconductor device, comprising:

a first-conductivity-type collector layer having a rear surface on which a collector electrode is formed;

a second-conductivity-type buffer layer laminated on said collector layer;

a second-conductivity-type conductivity modulation layer formed on said buffer layer;

a first-conductivity-type emitter layer formed as a well in a surface of said conductivity modulation layer;

a second-conductivity-type source region formed in a surface of a well edge portion of said emitter layer;

a gate electrode formed on a gate insulating film to overlap said source region and said conductivity modulation layer;

a second-conductivity-type source contact layer formed in a surface of said emitter layer to be spaced from said source region;

a second gate electrode formed through a gate insulating film to overlap said source region and said source contact layer; and an emitter electrode that is in ohmic contact with both said emitter layer and said source contact layer.

7. A semiconductor device as defined in claim 6, further including a second emitter electrode which is in ohmic contact with the surface of the well edge portion of said emitter layer.

* * * * *